United States Patent [19]

Mattes

[11] Patent Number: 4,865,681
[45] Date of Patent: Sep. 12, 1989

[54] MAGNETIC FIELD EPITAXY

[75] Inventor: Brenton L. Mattes, Ann Arbor, Mich.

[73] Assignee: Board of Regents Acting for and on Behalf of the University of Michigan, Ann Arbor, Mich.

[21] Appl. No.: 815,267

[22] Filed: Dec. 24, 1985

Related U.S. Application Data

[63] Continuation of Ser. No. 465,173, Feb. 9, 1983, abandoned.

[51] Int. Cl.$^4$ .................................................. C30B 7/00
[52] U.S. Cl. ........................... 156/624; 156/DIG. 64; 156/DIG. 76; 505/818; 427/47; 427/62
[58] Field of Search ....... 156/624, DIG. 76, DIG. 89, 156/DIG. 64, 600; 427/47, 87, 62; 148/108, 33.4, 171; 428/450; 505/815, 816, 817, 818

[56] References Cited

U.S. PATENT DOCUMENTS 3,961,103  6/1976  Aisenberg ............................. 427/39
3,975,218  8/1976  Ruehrwein ........................... 148/175
4,222,814  9/1980  Reitz ................................... 156/600

FOREIGN PATENT DOCUMENTS 143009  11/1980  Japan ................................... 427/47
177517  11/1982  Japan ................................... 427/47

OTHER PUBLICATIONS

Kvapil et al., Jl. of Crystal Growth 8, No. 2, 1971, pp. 162–164.
Utech et al., Jl. of Applied Physics, vol. 37, No. 5, 1966, pp. 2021–2023.

Primary Examiner—Robert L. Stoll
Assistant Examiner—R. Bruce Breneman
Attorney, Agent, or Firm—Robert B. Stevenson

[57] ABSTRACT

A method of growing an epitaxial interface comprising the steps of selecting a crystalline substrate (e.g. Si) characterized by a crystal lattice substantially similar to the crystal lattice to be grown (e.g. CuCl); applying a magnetic field to the crystalline substrate; and growing a crystal layer on the selected substrate in the presence of a magnetic field. Preferably the crystal growth takes place from a liquid phase eutectic mixture (e.g. $CuCl/NH_4Cl$) at conditions near the eutectic point. The epitaxial interface produced is very reproducible, uniform and stable, yet the region appears to be highly strained due to the lattice mismatch. Anomalous superdiamagnetism, very low electrical resistivity and the ability to trap and channel light (index of refraction approaching infinity) are observed at the epitaxial interface at essentially ambient conditions suggestive of high temperature superconductivity. Cessation of the anomalous properties as a function of magnetic field strength is determined by selection of the magnetic field strength employed during crystal growth.

5 Claims, No Drawings

MAGNETIC FIELD EPITAXY

This is a continuation of prior U.S. application Ser. No. 465,173, filed Feb. 9, 1983, now abandoned.

BACKGROUND OF THE INVENTION

1. Field of the Invention

This invention relates to a method for producing an epitaxial interface that exhibits anomalous properties. More specifically, the invention relates to the growth of a crystal lattice on a crystalline substrate in the presence of a magnetic field.

2. Description of the Prior Art

Since the discovery of superconductivity by Kamerlingh Onnes in 1911, the scientific community has marveled, speculated, and pursued both the theoretical explanation and practical application of such concepts as electrical current without resistance, superdiamagnetism, high magnetic field reflection and expulsion, and other associated phenomena. With the advent of contemporary theoretical models and concepts such as BCDS theory and the Cooper electron pair, exciton/plasmon condensation and high temperature superconductivity-like states, magnetic flux quantitization and the concept of a macroscopic quantum state, as well as others, a rebirth of interest in practical applications of superconductivity has taken place. Thus, it is commonplace today to speak of both micro applications of superconductivity such as electronics (e.g. Josephson's junction, SQUID, etc.) and macro applications of superconductivity such as superconductive motors, generators and magnets, superconductive power transmission and even magnetic levitation.

However, all practical applications of superconductivity have been historically viewed as being restricted to very low temperatures below the critical temperature, $T_c$, of the superconductive composition. Since the intermetallic type II superconductor $Nb_3Ge$ is generally accepted as having the highest known $T_c$ of slightly over 23° K. and in view of contemporary theoretical considerations leading to the prediction of about 40° K. being an upper limit to $T_c$, the prospect of utilizing superconductive properties at ambient conditions does not appear to be likely. Yet, much is still to be learned and certain experimental observations lead one to question such conclusions.

For example, magnetic flux exclusion (the Meissner effect), a well known experimental manifestation of superconductivity, has been reported in the literature to occur in pressure-quenched CdS at 77° K. Also, at least three groups have reported observation of anomalies in CuCl at ultra high pressures (e.g. 7 orders of magnitude change in conductivity at 40 kbar and room temperature and a $T_c$ as high as 150° K. with superdiamagnetism at pressures of several kbars). However, some of these observations as well as other reported observations (e.g. superconducting fluctuations in TTF-TCNQ at 60° K.) have not been entirely reproducible.

SUMMARY OF THE INVENTION

In view of the prior art, I have discovered a method of preparing a "crystalized amorphous" state by epitaxially depositing one substance on a substrate in the presence of a magnetic field. This crystalized amorphous state can be viewed as a condensed state of metastable atom clusters stabilized by an epitaxial registry on a crystalline substrate wherein the registry induces a high surface pressure and long range order. The resulting interface is highly strained, yet highly ordered and exhibits superdiamagnetism at high temperatures along with an ability to virtually trap light.

Thus, this invention provides a method for producing a crystalline interface with anomalous diamagnetic, optical or electrical transport properties comprising the steps of:

(a) selecting a crystalline substrate characterized by a crystal lattice structure substantially similar to the crystal lattice structure of a second crystalline substance to be grown on the crystalline substrate;

(b) applying a magnetic field to the crystalline substrate; and (c) growing the second crystalline substance on the selected crystalline substrate in the presence of the applied magnetic field, thus producing the crystalline interface.

The invention further provides that the growing of the second crystalline substance on the selected crystalline substrate in the presence of the applied magnetic field is from a liquid phase eutectic mixture in contact with the selected crystalline substrate at conditions near the eutectic point. Preferably, the selected crystalline substrate is Si and said second crystalline substance is CuCl from a $CuCl/NH_4Cl$ eutectic mixture. The invention also provides for establishing the upper limit of the magnetic field strength dependency and the cessation of anomalous properties by virtue of the selection of the magnetic field strength employed during the growth of the epitaxial inteface.

It is a primary object of the invention to provide a method of producing an epitaxial interface exhibiting anomalous properties. It is a further object that the anomalous behavior involves the observation of superconductivity related properties at high temperatures. Thus, it is an associated object to provide a method of extending superconductivity to ambient conditions. It is another object to provide a method and composition capable of trapping light. And still another object is to provide a method to control the cessation of such anomalies as a function of upper magnetic field strength. Fulfillment of these objects and the presence and fulfillment of other objects will be apparent upon complete reading of the specification and claims.

DESCRIPTION OF THE PREFERRED EMBODIMENTS

The novel method of producing an epitaxial interface that exhibits anomalous properties according to the instant invention, in its broadest sense, involves intentionally promoting crystalline growth in the presence of a magnetic field. In other words, the novel method involves epitaxially depositing one crystalline substance on another crystalline substrate in the presence of a strong magnetic field. The method further involves a liquid phase epitaxial (LPE) technique wherein a selected crystalline substrate which serves an epitaxial registry is immersed in a liquid phase crystal growth media. The substrate is held in a known relationship or orientation relative to the externally applied magnetic field while the second crystalline material is deposited from the liquid phase onto the substrate. Preferably, a static magnetic field of about 1 to 6 kG or larger is applied perpendicular to the substrate. However, fields at other angles, and in particular parallel to the substrate, are contemplated as potentially useful depending on the selection and geometry or shape of the substrate and the identity and mechanism by which the selected crystal growth media deposits on that substrate.

Although the crystal growth mechanism and resulting structure are not fully understood, it is theorized that the epitaxial interface produced according to the present invention is a stabilized metastable state induced by high radial pressure from a lattice mismatch at the interface resulting in high crystallinity and long range atomic order. This lattice mismatch induced pressure is viewed as being predominantly a large planar effect concentrated at the epitaxial interface and perhaps equivalent to the observation of the onset of superconductive properties at ultra high pressures in analogous chemical compositions. However, the anomalous properties in the present invention are manifesting themselves at high temperature and essentially ambient pressure. It can be rationalized that the interfacial composition of the instant invention is being held in a highly stressed environment synonymous with what a solid state crystalline substance experiences at temperatures approaching absolute zero.

It is further believed that the crystal growth mechanism or epitaxial deposition involves a metastable cluster characteristic of the liquid phase growth media. These clusters under the influence of the magnetic field and in the presence of the epitaxial registry of the crystalline substrate, form a condensed state of high surface pressure and long range order. As such, we have chosen to refer to the epitaxial interface as a "crystallized amorphous" state. In this state the lattice phonons in each cluster are coherently coupled to adjacent clusters which give rise to the observation of anomalous superconductivity related properties. Although proposing a specific quantum mechanical model for cluster to cluster interaction is far too tentative, the concept of direct phonon-phonon coupling or electron-phonon coupling including externally available bonding orbitals on the clusters is well within the realm of sound scientific speculation, and consistent with very recent one-dimensional and two-dimensional superconductivity theories. More importantly, experimental observation of a very large index of refraction (approaching infinity) at the epitaxial interface and the "light pipe" concept, as explained more fully later, is highly suggestive of a low frequency soft phonon mode.

In view of the above, it is further believed that utilizing a deep eutectic mixture, containing the phase to be deposited, as the liquid media for crystal growth enhances the desired epitaxial growth by virtue of the increased concentration of atomic clusters in solution. With accurate knowledge of the phase diagram including the presence of the eutectic point, the conditions favoring deposition of the desired solid phase can be readily selected. Experience has indicated that accurate temperature control and temperature gradient control during the actual expitaxial growth process are essential.

It has been established that the orientation of the substrate in the magnetic field during crystal growth will influence the thickness of the epitaxial interface. Yet very stable and reproducible uniform epitaxial layers can be readily achieved by the LPE growth system. In order to more fully describe the novel method of the instant invention and the many observed anomalous properties produced as a result of this novel process, the following discussion will be directed principally to the epitaxial growth of cuprous chloride, CuCl, on a silicon, Si, substrate. However, it is to be kept in mind that the principles and concepts revealed in the CuCl/Si system are viewed as basic concepts and generic principles of the "amorphous crystallized" state.

Stable and reproducible superdiamagnetic layers of CuCl epitaxially grown on Si substrates have been achieved by the LPE technique. This epitaxial growth technique is believed to stabilize a metastable state of CuCl (i.e., the CuCl clusters found in a liquid phase eutectic mixture of $CuCl/NH_4Cl$) by inducing a radial pressure from a lattice mismatch with the Si substrate. This technique produces a uniform "crystallized amorphous" state at the epitaxial interface reminiscent of the crystallized amorphous state previously observed as the result of ion milling thin films of Si for electron microscopy. However, in this case, the bonding and/or lattice phonon coupling between small metastable clusters is apparently very coherent resulting in the epitaxial interface exhibiting unusual electrical, optical and magnetic properties.

Preferably, the Si (111; Miller indices) crystal lattice plane is selected as the epitaxial registry or substrate for the LPE growth of CuCl. This selection is based on a strong crystal lattice similarity between Si and CuCl with only a slight lattice mismatch. However, other crystal lattice planes and other substrates are envisioned as being equivalent for purposes of this invention. The Si substrate ( e.g., 1 cm square wafer) is immersed in a deep eutectic composition of CuCl and $NH_4Cl$ to obtain a high density of CuCl clusters in the liquid phase and is rigidly held between the poles of an electromagnet (e.g., about 1 to 6 KG) with the Si (111) plane preferably perpendicular to the direction of the magnetic field. Care is taken to maintain accurate control of the temperature and temperature gradient while employing the external magnetic field during nucleation and growth which yields very stable uniform layers of CuCl on Si. The LPE growth system exhibits excellent temperature control from about 100° to 500° C. ($\pm 0.1°$ C.) and the temperature varies less than 1° C. from top to bottom of the melt.

Magnetic measurements were made on the CuCl/Si epitaxial system with a standard Foner magnetometer which was carefully calibrated and adjusted for each measurement with standard samples. The sample holder and the Si substrate were measured separately for background magnetic response. Various studies were performed, including temperature dependence, orientation of the epitaxial layer with respect to the magnetic field, and magnetic field strength dependence. Repeated measurements that involved a 45 minute transition from 77° K. to 300° K. showed a diamagnetic shift in parallel field oriented samples at approximately 125° K. (120° to 150° K.) which corresponds to anomalies observed in other sources of CuCl. The absolute diamagnetic exclusion attributed to the CuCl layer (i.e., the background response from the Si substrate and sample holder were subtracted and a strained interfacial region of approximately 0.1 $\mu$m was assumed) approached $-\frac{1}{4}\pi$ at 125° indicative of the theoretical (pure) superdiamagnetism limit. The exclusion reduced to approximately half this value at 300° K.

Orientation studies indicated that a strong anisotropy exists with the greatest diamagnetic effect being observed with the plane of the substrate parallel to the field. This is consistent with the largest field interacting with the bulk of the interface region. This diamagnetic anisotropy is also confirmed by the observation that the CuCl/Si sample suspended in a uniform magnetic field will rotate parallel to the field.

The epitaxial CuCl/Si interface has been studied by x-ray defraction, optical studies and electrical and magnetic measurements. In general, these layers are very reproducible and stable under a variety of environmental and experimental conditions. X-ray defraction of the CuCl on Si (111) substrates show $d_{(111)}$ CuCl=3.121 Å and $d_{(111)}$ Si=3.141 Å. In addition, a weak $d_{(111)}$ defraction pattern corresponding to 3.265 Å is observed which corresponds to an interfacial CuCl region that is compressed radially (i.e., expanded normal to the epitaxial plane) and strong interference peaks are observed at $d_{(111)}Si+nd_{(111)}CuCl/n+1$.

The latter peaks may indicate that the CuCl has highly ordered (111) planes normal to the epitaxial interface to Si.

Optical polarization experiments through the transparent CuCl layer appear to confirm a highly strained interfacial region when viewed parallel to the interface. When convergent light is focused on the edge of the layer, light is transmitted only through the strained region and interference fringes are observed. These optical effects could only occur if the index of reflection approached 90° (infinite refractive index). In other words, light impinging on the interface is optically trapped at the interface in an "optical pipe" effect. Visual microscopy confirms the presence of the optical pipe effect in that reflective lighting allows visual focusing on the outer surface of the CuCl while indirect lighting (even a light source behind the interface) appears to lend itself to visual focusing at the interface below the outer surface. In particular, light has been observed to be guided around the bottom side of the Si substrate wafer through the strained region of the CuCl layer to the top side of the substrate. Structural defects and other light scattering pheonomena can be directly observed. Scanning electron microscopy (SEM) also shows an anomalous electron scattering effect that appears to defocus the image in the interface region. This peculiar "light pipe" effect is observed to be essentially parallel to the substrate in the stressed region and appears to extend from the interface into the CuCl to approximately one $\mu$m. The SEM observations show the "fuzzy" region to extend approximately 0.1 $\mu$m into CuCl and may correspond to a reflection of the primary electron beam into the secondary electron detector. Raman scattering from the CuCl/Si interface shows strong Si peaks but very weak (if any) CuCl peaks at 300° and 77° K. The CuCl Raman spectra appear stronger with red compared to green light excitation. Again, it is felt that phonon scattering may be weak in CuCl because the lattice phonons are highly coherent and/or coupled.

Magnetic susceptibility has been studied as a function of magnetic field strength and is found to correlate with the field strength used during growth of the epitaxial layer. With the field greater than the growth field and parallel to the layer, the susceptibility decreases with time. Upon reducing the field, the susceptibility oscillates. In contrast, the Si substrate alone shows little response with no anomalous effects. Thus, the cessation of the anomalous magnetic behavior as a function of field strength can be predetermined by the selection-n of the field strength employed during epitaxial crystal growth. Similarly, the uniformity and thickness of the interfacial region can be changed with the static magnetic field applied during the nucleation and growth of the epitaxial layer. Electron spin resonance studies indicate that trace iron present in the CuCl layer decreases with increased magnetic field strength applied during growth. This iron segregation and reduced iron content significantly increases the epitaxial layer's diamagnetic response. Also, magnetic fields parallel to the substrate appear to yield a thicker strained interface layer. However, the diamagnetic response becomes more anisotropic in the plane of the substrate.

Low resistivities have been observed in the CuCl/Si system at temperatures greater than 300° K. Since the thin CuCl film (1 $\mu$m thickness) deposited on Si is very soft, direct electrical contacts and contact potentials are a problem. However, measurements indicate that the interfacial region of the CuCl has very low resistance even though the bulk of the outer CuCl layer is a good insulator. Currents ($10^{-9}$ to $10^{-1}$ amps) passed into the Si appear to be shunted by the interface and do not appear to induce voltage changes between probes placed on top of the CuCl between the currect electrodes. Transients and fluctuations in the voltage are observed when the current is suddenly applied and/or reversed. The CuCl appears to be relatively free of excess copper since no electrolytic deposits have been observed at the current electrodes.

Although to a degree some of the numerical values and specific details and even the very presence of certain observed properties may be intrinsic to the CuCl/Si system, it is believed that the overall observation of anomalous magnetic, optical and electrical transport phenomena is characteristic of the "crystalline amorphous" state produced by the LPE technique employing an externally applied magnetic field to produce a coherent order during crystal growth. Thus, the process should not be viewed as being limited to the growth of CuCl on a Si substrate, but in its broadest sense is related to the epitaxial depositing of any substance on a similar substrate wherein the structural order and resulting properties are enhanced by the presence of the magnetic field. Although preferably the substrate is selected by virtue of a slight lattice mismatch, the process is not limited to two chemically dissimilar compositions, but rather it is felt that the LPE growth of a cluster of one composition on a similar substrate as well as a different compositional substrate should be considered equivalent. The process is also viewed as being generally applicable to repetitious and/or sequential deposition of multiple layers and laminations of selected substances.

All of the properties observed as a result of the process of the instant invention and in particular, the implied underlying theories (e.g., soft phonon mode and two-dimensionality) are consistent with the concept of ultra high $T_c$ superconductivity. The fact that a static magnetic field (e.g., 1 to 6 kG) applied perpendicular to the substrate during crystal growth results in the observation of constant diamagnetic susceptibility up to that applied field (type I superconductor) and decreasing susceptibility thereafter (type II superconductor), suggests and implies that at higher growth fields or higher growth temperatures, the susceptibility may behave like a type I superconductor; i.e., a "critical field" may be induced during the growth and may be related to the melting temperature. This in principle implies a $T_c$ as high as 800° K. in the CuCl/Si system and even a 1688° K. $T_c$ for Si clusters grown on a Si substrate.

While the invention has been described with a certain degree of particularity, it is manifest that many changes may be made in the details without departing from the spirit and scope of this disclosure. It is understood that the invention is not limited to the exemplified embodiments set forth herein but is to be limited only by the scope of the attached claim or claims, including the full range of equivalency to which each element thereof is entitled.

I claim:

1. A method for producing an interface comprising the steps of:
   (a) selecting a crystalline substrate characterized by a crystal lattice structure substantially similar to the crystal latice structure of a second crystalline substance to be grown on said crystalline substrate;
   (b) applying a magnetic field to said crystalline substrate;
   (c) growing said second crystalline substance on said selected crystalline substrate in the presence of said applied magnetic field; and
   (d) recovering an interface wherein said selected crystalline substrate is Si and said second crystalline substance is CuCl.

2. A method of claim 1 wherein said growing of said second crystalline substance on said selected crystalline substrate in the presence of said applied magnetic field is from a liquid phase eutectic mixture in contact with said selected crystalline substrate at conditions near the eutectic point.

3. A method for establishing the upper limit of the magnetic field strength dependency of anomalous properties of an epitaxial interface involving the steps of selecting a magnetic field strength for the magnetic field employed during growth of the epitaxial interface such that said selected magnetic field strength corresponds essentially to the desired field strength for cessation of anomalous properties.

4. A method for establishing the upper limit of the magnetic field strength dependency of anomalous properties of an epitaxial interface involving the steps of selecting a magnetic field strength for the magnetic field employed during growth of the epitaxial interface such that said selected magnetic field strength corresponds essentially to the desired field strength for cessation of anomalous properties, wherein said epitaxial interface involves CuCl deposited on Si at a magnetic field strength between about 1 to 6 kG.

5. A method of producing an epitaxial interface comprising the steps of:
   (a) selecting a crystalline substrate characterized by a crystal lattice substantially similar to the crystal lattice to be grown;
   (b) applying a magnetic field to said crystalline substrate; and
   (c) growing a crystal layer on said selected substrate in the presence of said applied magnetic field thus producing an epitaxial interface, wherein said growing of said crystal layer on said substrate is from a liquid phase eutectic mixture in contact with said selected crystalline substrate at conditions near the eutectic point, and wherein magnetic field dependency of the properties of said epitaxial interface is determined by the field strength of the applied magnetic field during crystal growth, and wherein said substrate is Si, said crystal layer grown on said substrate is CuCl and said eutectic mixture is $CuCl/NH_4Cl$.

* * * * *